United States Patent
Lee

(10) Patent No.: US 7,956,674 B2
(45) Date of Patent: Jun. 7, 2011

(54) RESERVOIR CAPACITOR ARRAY CIRCUIT

(75) Inventor: Jong Won Lee, Gwangmyeong-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/459,037

(22) Filed: Jun. 26, 2009

(65) Prior Publication Data

US 2010/0141333 A1     Jun. 10, 2010

(30) Foreign Application Priority Data

Dec. 5, 2008    (KR) ........................ 10-2008-0123556

(51) Int. Cl.
    *G11C 5/14*         (2006.01)
    *H03K 19/173*    (2006.01)
(52) U.S. Cl. ..................... 327/530; 327/525; 365/149
(58) Field of Classification Search ................... None
See application file for complete search history.

(56) References Cited

U.S. PATENT DOCUMENTS

| | | | |
|---|---|---|---|
| 5,943,581 A | 8/1999 | Lu et al. | |
| 6,204,723 B1 | 3/2001 | Houghton et al. | |
| 6,392,909 B1 * | 5/2002 | Jang et al. | 365/225.7 |
| 7,107,467 B2 * | 9/2006 | Lee et al. | 713/300 |
| 7,176,552 B2 | 2/2007 | Park et al. | |
| 7,570,076 B2 * | 8/2009 | Marshall et al. | 326/16 |
| 2006/0082224 A1 | 4/2006 | Marshall et al. | |
| 2007/0070724 A1 | 3/2007 | Jang | |
| 2009/0040857 A1 * | 2/2009 | McNeil et al. | 365/226 |

FOREIGN PATENT DOCUMENTS

KR    10-2004-0095888 A    11/2004
KR    10-2006-0101685 A    9/2006

* cited by examiner

*Primary Examiner* — Lincoln Donovan
*Assistant Examiner* — Terry L Englund
(74) *Attorney, Agent, or Firm* — John P. White; Cooper & Dunham LLP

(57) ABSTRACT

A reservoir capacitor array circuit capable of allowing an internal voltage to be maintained stably, comprises a plurality of reservoir capacitors, each of the reservoir capacitors including a switch element which is connected between a power source voltage and a prescribed node and switched in response to a test enable signal which is enabled depending on a test mode signal or whether the fuse is cut or not, and a capacitor connected between the node and a ground voltage.

16 Claims, 5 Drawing Sheets

RESERVOIR CAPACITOR ARRAY CIRCUIT

TECHNICAL FIELD

The present invention relates to a memory device, and more particularly to a reservoir capacitor array circuit capable of deactivating a capacitor in which the leakage current is generated.

BACKGROUND

Generally, the semiconductor memory device is supplied with a power source voltage VDD and a ground voltage VSS from the outside and generates an internal voltage which is necessary for internal operations. As the voltage which is necessary for the internal operations of the semiconductor memory device, there are a core voltage VCORE supplied to a memory core region, a high voltage VPP used to drive a word line or during an overdriving, and a back bias voltage VBB supplied as a bulk voltage of NMOS transistor in the core region.

The level of various internal voltages can be subject to fluctuation due to a level change in the power source voltage VDD or a rapid consumption of the current, in which the fluctuation of the internal voltage acts as an obstacle factor against a high speed operation in a low power source voltage VDD. Therefore, in order to reduce the fluctuation of the internal voltage, the prior semiconductor memory device allows the internal voltage to be maintained stably using the reservoir capacitor array which can provide sufficient charge to the internal voltage.

FIG. 1 is a drawing showing the structure of the semiconductor memory device including the reservoir capacitor array according to prior art.

As shown in FIG. 1, the prior semiconductor memory device has various reservoir capacitor arrays for maintaining the internal voltage stably arranged in a peri region. As the reservoir capacitor array included in the prior semiconductor memory device, there are a peri voltage reservoir capacitor array for maintaining the peri voltage stably, a back-bias voltage reservoir capacitor array for maintaining the back-bias voltage stably, and a high voltage reservoir capacitor array for maintaining the high voltage VPP stably. Each of such various reservoir capacitor arrays is configured with a plurality of reservoir capacitors.

FIG. 2 is an equivalent circuit diagram of the reservoir capacitor included in the reservoir capacitor array according to prior art.

As shown in FIG. 2, the reservoir capacitor is consisted of capacitors C1, C2 connected in parallel between a power source voltage VDD and a ground voltage VSS. The capacitors are connected in parallel for the purpose of ensuring sufficient capacitance.

By the way, the capacitors C1, C2 included in the reservoir capacitors are subject to a defect or a physical damage during a manufacturing process and thus the leakage current through the capacitors C1, C2 can be generated. For example, if the physical damage is caused in the capacitor C1, the leakage current is generated through the capacitor C1. Since such generated leakage current can lead to an increase in current consumption at a standby state, it acts as a fatal obstacle factor in a mobile product in which the current consumption at the standby state is a substantial performance index.

BRIEF SUMMARY

In an aspect of this disclosure, there is provided a reservoir capacitor array circuit capable of sensing whether a leakage current is generated in a capacitor included in the reservoir capacitor array depending on a test mode signal and deactivating the capacitor in which the leakage current is generated.

In an embodiment, a reservoir capacitor array circuit capable of allowing an internal voltage to be maintained stably, comprises a plurality of reservoir capacitors, each of the reservoir capacitors including a switch element which is connected between a power source voltage and a prescribed node and switched in response to a test enable signal which is enabled depending on a test mode signal or whether a fuse is cut or not; and a capacitor connected between the node and a ground voltage.

In another embodiment, a reservoir capacitor array circuit comprises an enable signal generating unit including a fuse and at least one enable signal generator which generates a test enable signals determined to be enabled depending on a test mode signal or whether a fuse is cut or not, and a reservoir capacitor array including a plurality of reservoir capacitors, wherein each of the plurality of reservoir capacitors has capacitance determined in response to the test enable signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intend to limit the scope of the invention.

Figure 1:
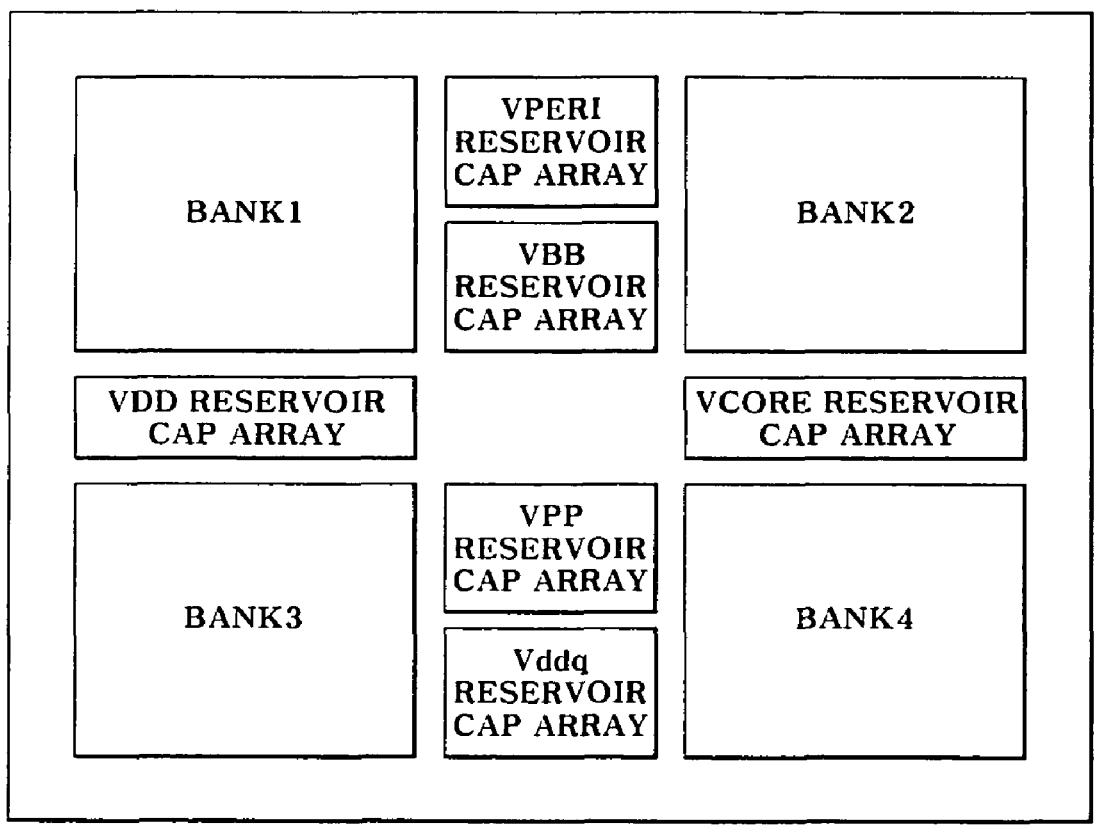
FIG. 1 is a diagram showing the structure of a semiconductor memory device including a reservoir capacitor array according to prior art.
Figure 2:
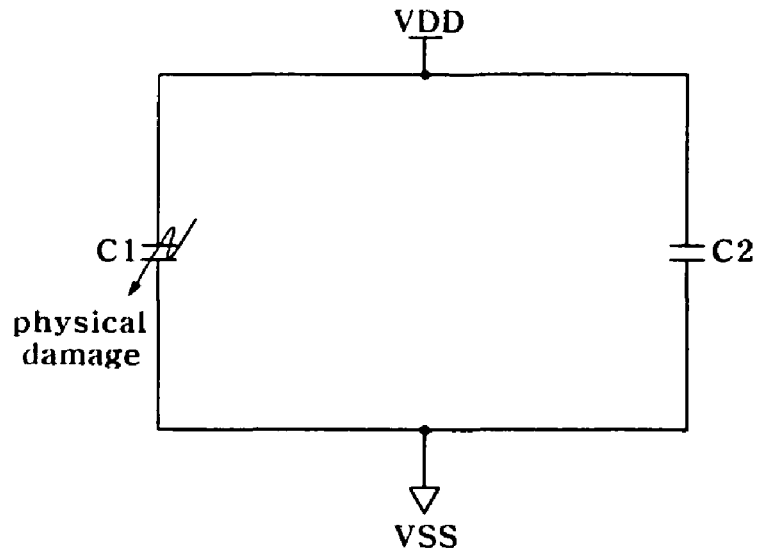
FIG. 2 is an equivalent circuit diagram for a reservoir capacitor included in the reservoir capacitor array according to prior art.
Figure 3:
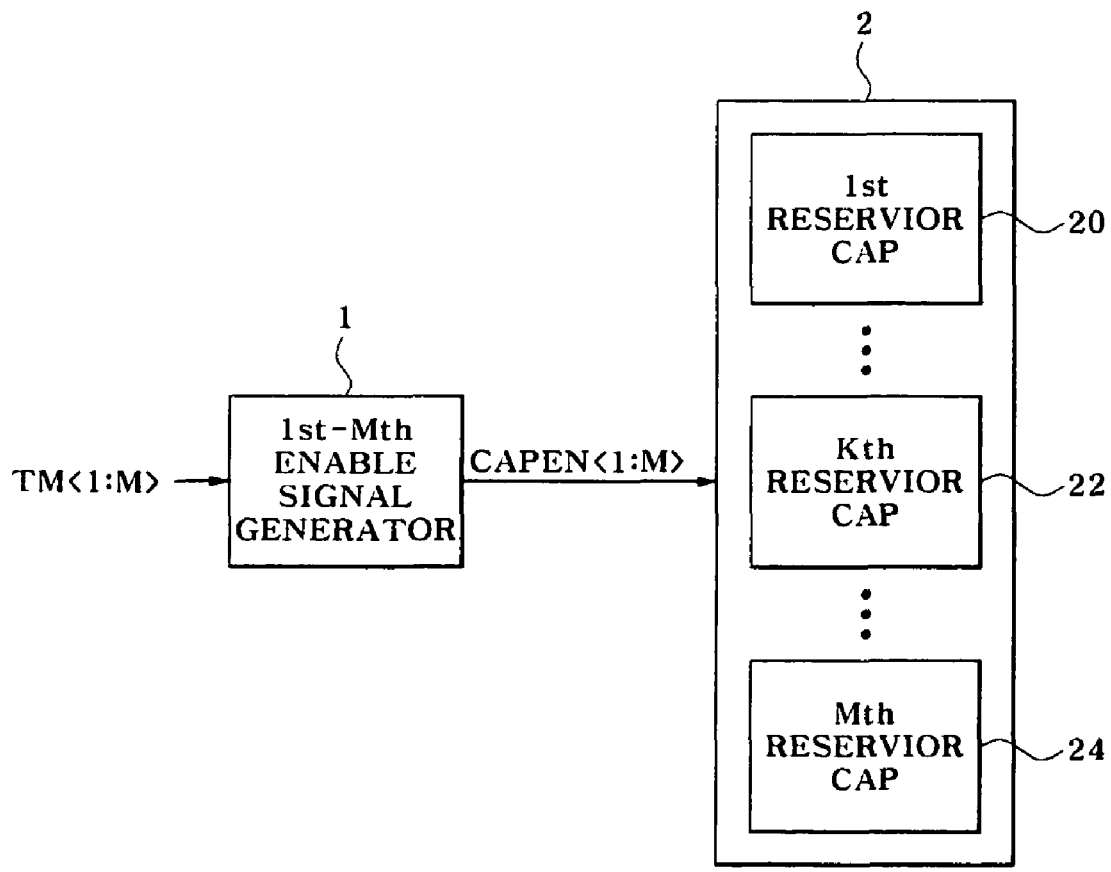
FIG. 3 is a block diagram showing a structure of a reservoir capacitor array circuit according to an embodiment of the present invention.

FIG. 3 is a block diagram showing a structure of a reservoir capacitor array circuit according to a first embodiment of the present invention.

The reservoir capacitor array circuit shown in FIG. 3 includes an enable signal generating unit 1 consisted of first to Mth enable signal generators and a reservoir capacitor array 2 consisting of first reservoir capacitor to Mth reservoir capacitor 24. Since the first to Mth enable signal generators are inputted with first to Mth test mode signal TM<1:M> and generate first to Mth capacitor enable signal CAPEN<1:M>, respectively, the structure of only a first enable signal generator among the first to Mth enable signal generators will be hereinafter described.

Figure 4:
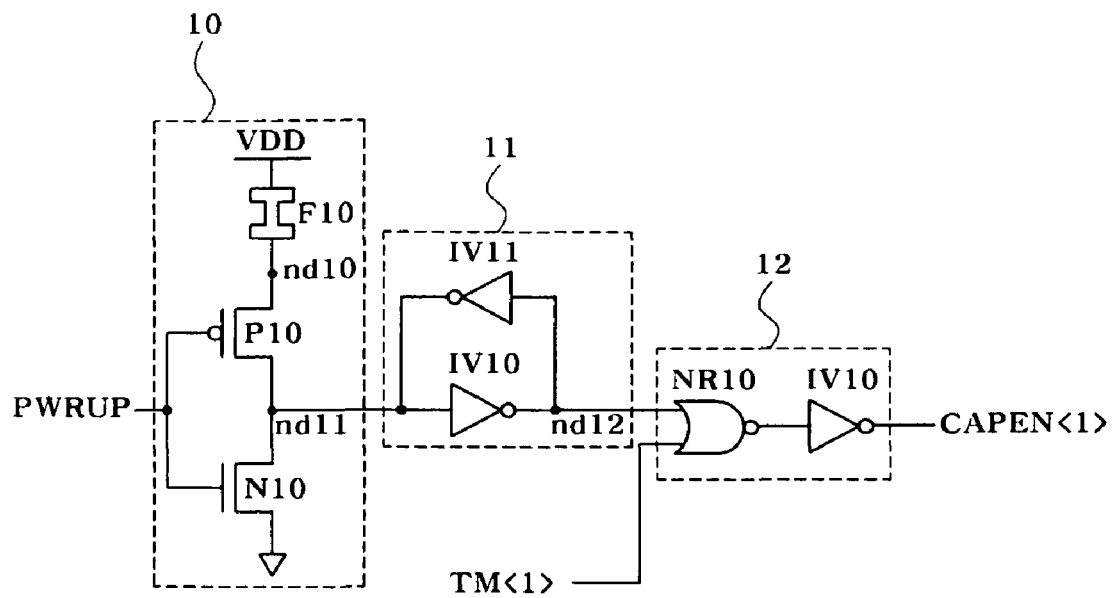
FIG. 4 is a circuit diagram showing a first enable signal generator included in the reservoir capacitor array circuit of FIG. 3.

FIG. 4, shows a circuit diagram of an enable signal generator configured with a driving unit 10, a latch unit 11 and a logic unit 12. The driving unit 10 is configured with a fuse F10 which is connected between a power source voltage VDD and a node nd10, a PMOS transistor P10 which is connected between the node nd10 and a node nd11 and operates as a pull-up element which pull-up drives the node nd11 in response to a power-up signal PWRUP, and a NMOS transistor N10 which is connected between a node nd11 and a ground voltage VSS and operates as a pull-down element which pull-down drives the node nd11 in response to the power-up signal PWRUP. The latch unit 11 consists of inverters IV10, IV11, latches a signal of the node nd11 and outputs it to the node nd12. The logic unit 12 receives a signal of the node nd12 and a test mode signal TM<1> and carries out a logic OR operation to generate a first capacitor enable signal CAPEN<1>. Herein, the power-up signal PWRUP maintains a high level during a prescribed section (hereinafter, referred to as a 'power-up section') after the power source is applied to the semiconductor memory device and transits to a low level if the power-up section is terminated.

The enable signal generating unit 1 allows the first capacitor enable signal CAPEN<1> to be at a high level if the first test mode signal TM<1> of high level is applied. Meanwhile, if the test mode signal TM<1> of low level is applied, the level of the first capacitor enable signal CAPEN<1> is determined depending on whether the fuse F10 is cut or not. In other words, the first capacitor enable signal CAPEN<1> becomes a low level in response to the power-up signal PWRUP of low level after the power-up section is terminated if the fuse F10 is not cut, and the first capacitor enable signal CAPEN<1> becomes a high level in response to the power-up signal PWRUP of high level during the power-up section if the fuse F10 is cut.

The first to Mth reservoir capacitors have capacitance controlled according to the first to Mth capacitor enable signals CAPEN<1:M> respectively. Since the first to Mth reservoir capacitors are all implemented with the same structure, the structure of the Kth reservoir capacitor will be described with reference to FIG. 5 to FIG. 7 corresponding to first to third embodiments, respectively.

Figure 5:
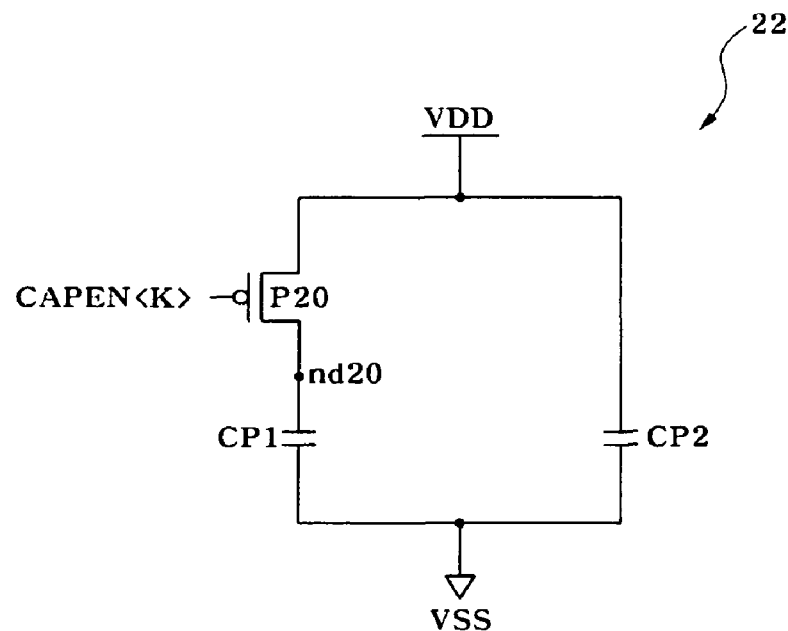
FIGS. 5 to 7 are diagrams showing various embodiments of Kth reservoir capacitor included in the reservoir capacitor array circuit of FIG. 3.

Referring to FIG. 5, the Kth reservoir capacitor 22 according to the first embodiment is configured with a first PMOS transistor P20 which is connected between the power source voltage VDD and a node nd20 and operates as a switch element which is turned on in response to the corresponding Kth capacitor enable signal CAPEN<K>, a first capacitor CP1 which is connected between the node nd20 and the ground voltage VSS, and a second capacitor CP2 connected between the power source voltage VDD and the ground voltage VSS. The Kth reservoir capacitor 22 shown in FIG. 5 has capacitance which is a sum of the capacitance of the first capacitor CP1 and capacitance of the second capacitor CP2 if the Kth capacitor enable signal CAPEN<K> is at a low level and it has a capacitance IS which is the same as that of the second capacitor CP2 if the Kth capacitor enable signal CAPEN<K> is at a high level. Since it is determined whether the first capacitor CP1 is activated or not depending on the Kth capacitor enable signal CAPEN<K> in such Kth reservoir capacitor 22 shown in FIG. 5, it is possible to test whether a defect or a physical damage is caused in the first capacitor CP1 during a manufacturing procedure.

Figure 6:
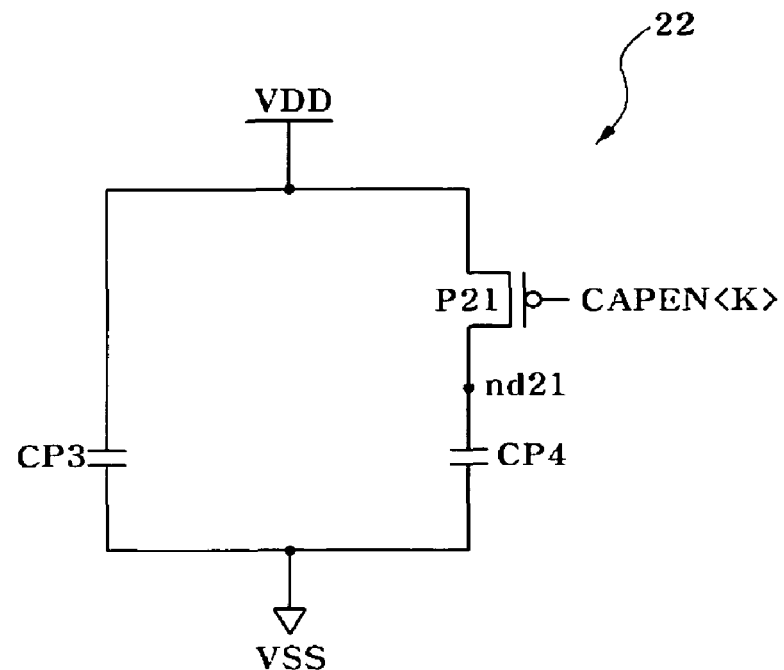

Referring to FIG. 6, the Kth reservoir capacitor 22 according to the second embodiment is configured with a third capacitor CP3 which is connected between the power source voltage VDD and the ground voltage VSS, a second PMOS transistor P21 which is connected between the power source VDD and the node nd21 and operates as a switch element which is turned on in response to the Kth capacitor enable signal CAPEN<k>, and a fourth capacitor CP4 which is connected between the node nd21 and the ground voltage VSS. The Kth reservoir capacitor 22 shown in FIG. 6 has a capacitance which is a sum of the capacitance of the third capacitor CP3 and capacitance of the fourth capacitor CP4 if the Kth capacitor enable signal CAPEN<K> is at a low level and it has a capacitance which is the same as that of the third capacitor CP3 if the Kth capacitor enable signal CAPEN<K> is at a high level. Since it is determined whether the fourth capacitor CP4 is activated or not depending on the Kth capacitor enable signal CAPEN<K> in such Kth reservoir capacitor 22 shown in FIG. 6, it is possible to test whether a defect or a physical damage is caused in the fourth capacitor CP4 during the manufacturing procedure.

Figure 7:
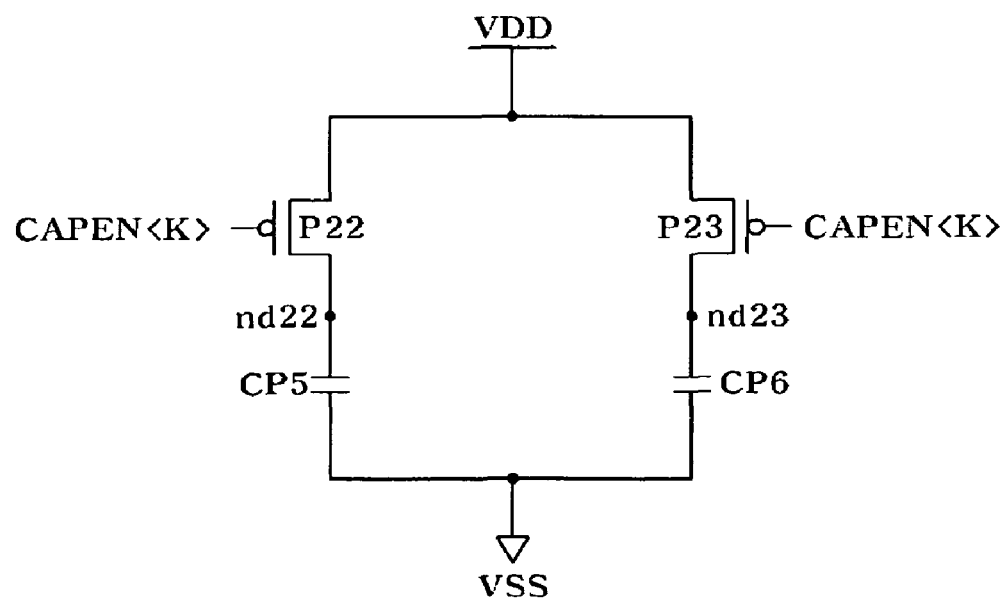

Referring to FIG. 7, the Kth reservoir capacitor 22 according to the third embodiment is configured with a third PMOS transistor P22 which is connected between the power source voltage VDD and a node nd22 and operates as a switch element turned on in response to the Kth capacitor enable signal CAPEN<K>, a fifth capacitor CP5 which is connected between the node nd22 and the ground voltage VSS, a fourth PMOS transistor P23 which is connected between the power source voltage VDD and a node nd23 and operates as a switch element turned on in response to the Kth capacitor enable signal CAPEN<K>, and a sixth capacitor CP6 which is connected between the node nd23 and the ground voltage VSS. Such Kth reservoir capacitor 22 shown in FIG. 7 has a capacitance which is a sum of the capacitance of the fifth capacitor CP5 and capacitance of the sixth capacitor CP6 if the Kth capacitor enable signal CAPEN<K> is at a low level, and it has a capacitance of zero if the Kth capacitor enable signal CAPEN<K> is at a high level. Since it is determined whether the fifth capacitor CP5 and the sixth capacitor CP6 are activated or not depending on the Kth capacitor enable signal CAPEN<K> in such Kth reservoir capacitor 22 shown in FIG. 7, it is possible to test whether a defect or a physical damage is caused in the fifth capacitor CP5 and the sixth capacitor CP6 during the manufacturing procedure.

Figure 8:
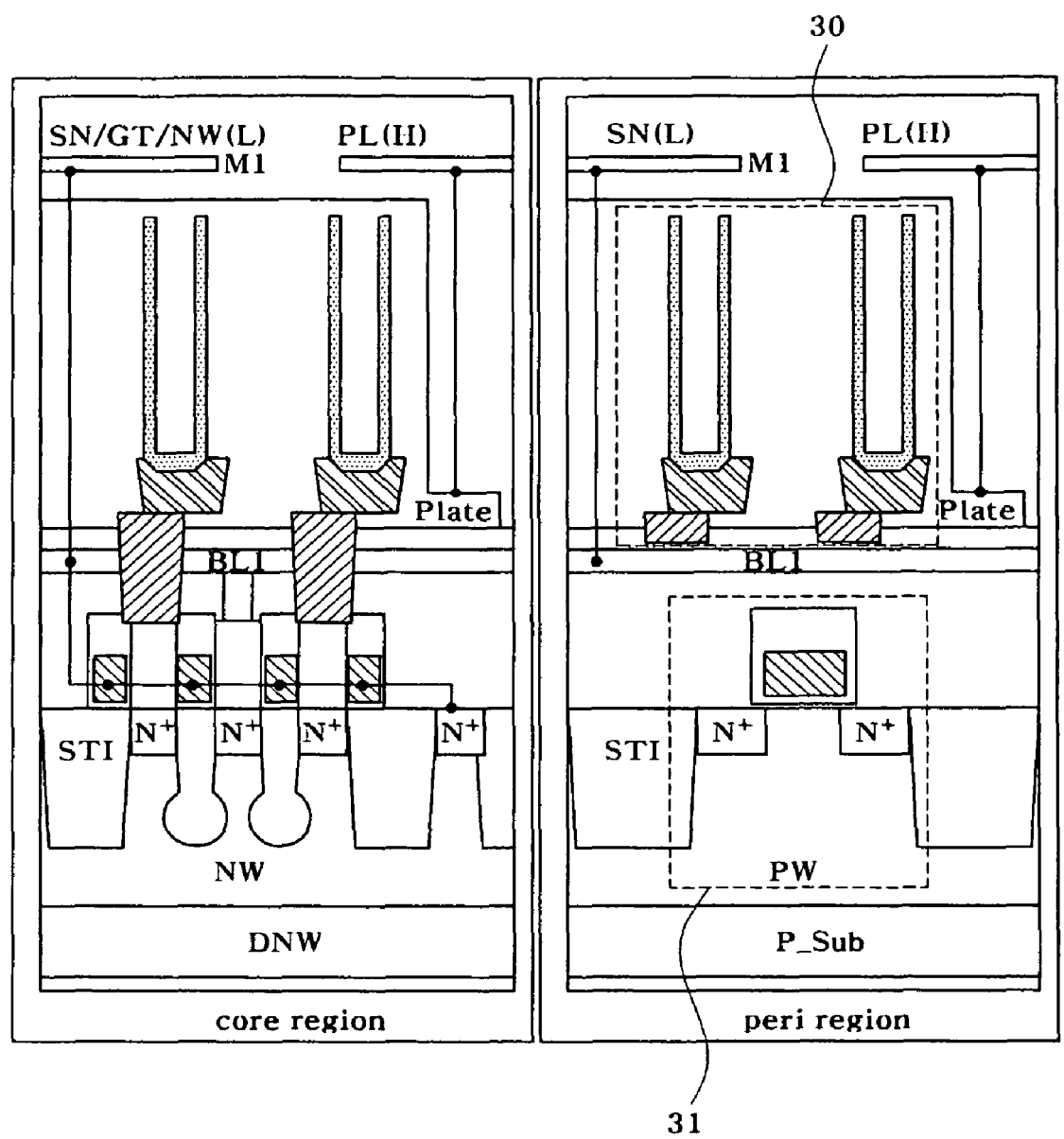
FIG. 8 is a cross-sectional view showing a capacitor and a switch element that can be used as one of the capacitors and one of the switch elements included in the Kth reservoir capacitor of FIGS. 5 to 7.

FIG. 8 illustrates a cross-sectional view of a capacitor 30 used as first to sixth capacitors CP1-CP6 and a MOS transistor 31 used as the first to fourth PMOS transistors P20-P23. The MOS transistor 31 is formed on a peri region and the capacitor 30 is formed on a MOS transistor 31.

Hereinafter, an example of operation of the reservoir capacitor array circuit will be described.

First, referring to FIG. 3 to FIG. 4, when the first to Mth test mode signals TM<1:M> are sequentially inputted at a high level, the first to Mth enable signal generators included in the enable signal generating unit 1 generate the first to Mth capacitor enable signals CAPEN<1:M>, respectively, which are sequentially enabled at a high level. For example, when the Kth test mode signal TM<K> is inputted at a high level, the Kth capacitor enable signal CAPEN<k> generated at the Kth enable signal generator becomes a high level.

Next, an amount of current consumption is measured at the standby state. At this time, the capacitance of the first to Mth reservoir capacitors is determined in accordance with a signal enabled at a high level among the first to Mth capacitor enable signals CAPEN<1:M>. For example, in a state that the Kth capacitor enable signal CAPEN<K> is enabled at a high level, the capacitors included in the Kth reservoir capacitor are partially or wholly deactivated. That is, the first capacitor CP1 is deactivated in a case of the Kth reservoir capacitor 22 shown in FIG. 5, the fourth capacitor CP4 is deactivated in a case of the Kth reservoir capacitor 22 shown in FIG. 6, and the fifth capacitor CP5 and the sixth capacitor Cp6 are deactivated in a case of the Kth reservoir capacitor 22 shown in FIG. 7. If the amount of current consumption measured is such states is largely reduced, it means that the leakage current is generated in the deactivated capacitor. Therefore, it is sensed that the leakage current is generated in the first capacitor CP1 in a case of the Kth reservoir capacitor 22 shown in FIG. 5, it is sensed that the leakage current is generated in the fourth capacitor CP4 in a case of the Kth reservoir capacitor shown 22 in FIG. 6, and it is sensed that the leakage current is generated in the fifth capacitor CP5 and the sixth capacitor CP6 in a case of Kth reservoir capacitor 22 shown in FIG. 7. It means that the defect or the physical damage is caused in the first capacitor CP1, the fourth capacitor CP4, the fifth capacitor CP5, and the sixth capacitor Cp6. While the amount of current consumption is measured in a standby state in this example, it can be measured in various states such as active state, precharge state, and power-down mode state depending on various embodiments.

Next, operations of deactivating the capacitor in which the defect or the physical damage is caused will be considered. As mentioned earlier, if the defect or the physical damage is caused in the first capacitor CP1, the fourth capacitor CP4, the fifth capacitor CP5 and the sixth capacitor CP6, the fuse included in the Kth enable signal generator is cut. The Kth enable signal generator in which the fuse is cut generates the Kth capacitor enable signal CAPEN<K> of a high level. Subsequently, it is allowed to deactivate the first capacitor CP1, the fourth capacitor Cp4, the fifth capacitor CP5 or the sixth capacitor CP6 in which the defect or the physical damage is caused.

The reservoir capacitor array circuit in each of the above-mentioned embodiments can sense the capacitors in which the defect or the physical damage is caused by applying the test mode signal and deactivate the capacitors in which the defect or the physical damage is caused by cutting the fuse. Therefore, it is possible to interrupt the leakage current generated due to the capacitor having the defect or the physical damage and thus to reduce the current consumption at the standby state.

The present disclosure claims priority to Korean application number 10-2008-0123556, filed on Dec. 5, 2008, the entire contents of which are incorporated herein by reference.

What is claimed is:

1. A reservoir capacitor array circuit capable of allowing an internal voltage to be maintained stably, the reservoir capacitor array circuit comprising a plurality of reservoir capacitors, and each of the reservoir capacitors comprising:
   a switch element connected between a power source voltage and a prescribed node and switched in response to a test enable signal which is enabled depending on a test mode signal or whether a fuse is cut or not;
   a first capacitor connected between the prescribed node and a ground voltage; and
   a second capacitor connected in parallel with said first capacitor and said switch element between said power source voltage and said ground voltage.

2. The reservoir capacitor array circuit of claim 1, wherein the switch element is turned off when the test mode signal is enabled or the fuse is cut.

3. The reservoir capacitor array circuit of claim 1, wherein the switch element is implemented as a MOS transistor which is formed on a peri region of a semiconductor memory device.

4. The reservoir capacitor array circuit of claim 3, wherein the first and the second capacitor are formed on the MOS transistor.

5. A reservoir capacitor array circuit, comprising:
   an enable signal generating unit including a fuse and at least one enable signal generator which generates a test enable signal determined to be enabled depending on a test mode signal or whether the fuse is cut or not; and
   a reservoir capacitor array including a plurality of reservoir capacitors, wherein each of the plurality of reservoir capacitors has capacitance determined in response to the test enable signal,
   wherein the enable signal generator comprises:
   a driving unit driving a first node in response to a power-up signal depending on whether the fuse is cut or not;
   a latch unit latchin a sisnal of the first node; and
   a logic unit receiving an output signal of the latch unit and the test mode signal, perform a logical operation, and generate the test enable signal.

6. The reservoir capacitor array circuit of claim 5, wherein the driving unit comprises:
   the fuse connected between a power source voltage and a second node:
   a pull-up element connected between the second node and the first node and pull-up driving the first node in response to the power-up signal; and
   a pull-down element connected between the first node and a ground voltage and pull-down driving the first node in response to the power-up signal.

7. The reservoir capacitor array circuit of claim 5, wherein the logic unit enables the test enable signal if the test mode signal is enabled or the fuse is cut.

8. The reservoir capacitor array circuit of claim 5, wherein each of the plurality of reservoir capacitors comprises:
   a switch element connected between a power source voltage and a prescribed node and switched in response to the test enable signal; and
   a first capacitor connected between the prescribed node and a ground voltage.

9. The reservoir capacitor array circuit of claim 8, wherein the switch element is turned off if the test mode signal is enabled or the fuse is cut.

10. The reservoir capacitor array circuit of claim 8, wherein the switch element is implemented as a MOS transistor formed on a peri region of a semiconductor memory device.

11. The reservoir capacitor array circuit of claim 10, wherein the first capacitor is formed on the MOS transistor.

12. The reservoir capacitor array circuit of claim 8, wherein each of the plurality of reservoir capacitors further comprises a second capacitor connected between the power source voltage and the ground voltage.

13. The reservoir capacitor array circuit of claim 5, wherein each of the plurality of reservoir capacitors comprises:
   a first switch element connected between a power source voltage and a first node and switched in response to the test enable signal;
   a first capacitor connected between the first node and a ground voltage;
   a second switch element connected between the power source voltage and a second node and switched in response to the test enable signal; and
   a second capacitor connected between the second node and the ground voltage.

14. The reservoir capacitor array circuit of claim 13, wherein the first and second switch elements are turned off if the test mode signal is enabled or the fuse is cut.

15. The reservoir capacitor array circuit of claim 13, wherein the first and second switch elements are each implemented as a MOS transistor formed on a peri region of a semiconductor memory device.

16. The reservoir capacitor array circuit of claim 13, wherein both of the first capacitor and the second capacitor are formed on a MOS transistor.

* * * * *